United States Patent [19]

Schnepf

[11] 3,798,036

[45] Mar. 19, 1974

[54] METHOD OF MANUFACTURING MICROSTRUCTURES

[75] Inventor: Hartmut Schnepf, Heilbronn-Klingenberg, Germany

[73] Assignee: Licentia Patent-Verwaltungs-G.m.b.H., Frankfurt am Main, Germany

[22] Filed: Mar. 31, 1972

[21] Appl. No.: 239,961

[30] Foreign Application Priority Data

Apr. 1, 1971 Germany ............................ 2115823

[52] U.S. Cl. ............................ 96/41, 96/362, 96/44

[51] Int. Cl. ............................................... G03c 5/04

[58] Field of Search .................... 96/36, 36.2, 44, 41

[56] References Cited

UNITED STATES PATENTS 3,594,168 7/1971 Compare ............................ 96/36.2

3,647,445 3/1972 Burns .................................. 96/36.2

3,129,098 4/1964 Kitson .................................. 96/35.1

3,518,084 6/1970 Barson et al. ......................... 96/38.4

*Primary Examiner*—Norman G. Torchin
*Assistant Examiner*—Edward C. Kimlin
*Attorney, Agent, or Firm*—Spencer & Kaye

[57] ABSTRACT

A method of manufacturing microstructures on a substrate comprises projecting at least one mask pattern onto a substrate through an objective lens and copying a further mask pattern onto the substrate by a contact process, the contact mask for the contact process being formed by projecting a mask pattern through the same objective lens onto a material for making the contact mask.

3 Claims, No Drawings

METHOD OF MANUFACTURING MICROSTRUCTURES

BACKGROUND OF THE INVENTION

The invention relates to a method for manufacturing microstructures on a substrate, and more particularly on a semiconductor plate, wherein the structures are repeatedly transferred from masks to the surface of the substrate, and more particularly in photosensitive layers of varnish on the substrate surface.

Semiconductor elements and integrated circuits are made in large numbers from a single semiconductor plate. Generally, known planar methods are used which comprise a plurality of successive masking, etching and diffusion or evaporation processes. The diffusion mask is usually a diffusion inhibiting insulating layer which is structured in accordance with regions to be diffused. The structuring of the insulating layer, consisting for example of silicon dioxide or of silicon nitride, is carried out by means of the known photo-varnish and etching method. A closed oxide layer on the surface of the semiconductor plate is covered with a photo-varnish, and the structures of a mask are reproduced thereon. After the exposure, the photo-varnish is developed and according to the type of photo-varnish used, either the exposed or the unexposed portions are dissolved in the developer, while the other parts of the varnish become resistant to an etching solution acting on the oxide layer. The parts of the oxide layer still covered with varnish are, therefore, not attacked by the etching solution during the subsequent etching, while the exposed regions of the oxide layer are removed by the etching agent down to the surface of the semiconductor. In this manner, diffusion windows and contacting windows are produced in the oxide masking layer. In a similar manner, metal layers applied by evaporation or otherwise may be structured, forming, for example, on the surface the conductor paths connecting the individual elements.

For the manufacture of integrated circuits, transistors and diodes, a plurality of such masking and etching processes must be carried out successively for producing the different regions in the semiconductor body, the contacts and the conductor paths. Different masks are always used which contain the necessary structure to be reproduced. Thus, for manufacturing a certain element or a certain integrated circuit a whole set of masks is necessary.

The exposure of the photo-sensitive layer of varnish on the substrate may be made in different ways. A usual method is the so-called contact copying method in which a mask is placed on the surface of the substrate carrying the layer of photo-varnish, and the structure of the mask is transferred into the layer of the varnish by exposure.

Another method is known under the designation of projection masking method. Here, the mask is transferred onto the light sensitive varnish layer on the substrate by an objective lens or projection lens, with high resolution. Compared with the contact copying method, the projection masking method has mainly the advantage that the mask does not make contact with the substrate and particularly with the layer of photo-varnish. With the contact copy, the superimposed mask frequently scratches the sensitive photo-varnish, leading to a substantial increase in waste.

For this reason, the projection masking method is preferred in many cases. However, reproduction errors, i.e., distortions, caused by imperfections in the objective lens cannot be completely avoided, and generally all masks required are transferred successively into the layers of photo-varnish with the same lens, so that the relative position of all structures is ensured in the finished product, i.e., all of the structures are aligned.

It appears that there are process steps in which the contact copying method would have to be preferred. However, if during the manufacture of an integrated circuit, some masking steps are transferred with the reproducing errors caused by the objective lens into the associated varnish layers by projection masking, and then one process step is made by means of a contact copy process, in which such reproducing errors do not appear, the divergence, i.e., misalignment, of the structures made by projection and by contact copy is so large that the elements or circuits made in this way no longer fulfil the necessary requirements.

SUMMARY OF THE INVENTION

The object of the invention is to reduce or obviate the above mentioned drawbacks.

According to the invention, there is provided a method of manufacturing microstructures on a substrate comprising the steps of projecting at least one mask pattern onto the surface of said substrate through an objective lens, separately copying a further mask pattern by projecting said further mask pattern through said objective lens onto a material for making a contact mask and contact copying the pattern of said contact mask onto said substrate by placing said contact mask directly onto said substrate.

DESCRIPTION OF THE PREFERRED EMBODIMENT

Basically, the invention proposes, in a method of the kind hereinbefore described, that during at least one transfer process during the manufacture, a mask pattern is transferred by projection masking to the surface of the substrate, e.g. a semiconductor wafer by means of an objective lens arranged between the mask pattern and the substrate surface and that during at least one further transfer process a contact mask is placed directly on the surface of the substrate and is reproduced on this surface by contact copy, this contact mask necessary for the contact copy being made from a corresponding projection-type mask pattern by reproducing this mask with the objective lens used for the projection masking steps.

In this manner, it is certain that the reproduction errors due to lens distortions are contained in the mask which is transferred by contact copy without further reproduction errors into the layer of photo varnish. This has the advantage that the errors occurring during projection masking are present also in the contact copy, and all of the structures on the semiconductor wafer are again ialignment. in alignment.

For the method according to the invention, a metal mask may be used as the material for making the contact copy mask. For making this mask, a metal foil is covered with photo-varnish. Into this photo-varnish, the structure of the corresponding mask, provided for projection masking, is reproduced by means of the same objective lens used for the projection masking steps. Then, according to the type of photo-varnish used, the negative or positive of the reproduced structures is etched into the metal foil.

In one exemplary process, the method according to the invention may be particularly useful where certain structures are produced on the semiconductor wafer by ion vaporization. The structure of the regions which are to be produced by vaporization, e.g. the regions of an oxide layer, are produced in this case preferably by a contact copy process in a varnish mask, because the varnishes used in this case are only very slightly suitable or are unsuitable for a projection masking process. At least one of the structures which is to be produced in this semiconductor arrangement would be produced with the use of a projection masking process.

The semiconductor plates may also be replaced by other substrates adapted to carry microstructures.

It is essential according to the invention for a mixed manufacturing method, in some of which the structures are produced by projecton masking and the other structures by contact copy, that the masks for the contact copy are first made from the corresponding masks provided for the projection masking. This is achieved by transferring the structure of the projection masking mask through the objective lens used for the projecting masking to a substrate used subsequently as contact copy mask.

It will be understood that the above description of the present invention is susceptible to various modifications changes and adaptations.

What is claimed is:

1. In a method of manufacturing microstructures on a semiconductor wafer where the structures are transferred to the surface of the semiconductor wafer by a plurality of masks, the improvement comprising the steps of:

a. providing a plurality of projection-type mask patterns;

b. projecting at least one of the projection-type mask patterns onto a photosensitive layer on the surface of said semiconductor wafer through an objective lens;

c. separately copying a further one of the projection-type mask patterns by projecting said further mask pattern through said objective lens onto a photosensitive layer or a masking material to make a contact mask; and, d. contact copying the pattern of said contact mask onto said semiconductor wafer by placing said contact mask directly onto said semiconductor wafer.

2. A method as defined in claim 1, wherein said pattern of said contact mask is copied onto a photosensitive layer on said surface of said semiconductor wafer.

3. A method as defined in claim 2, further comprising the step of coating a metal foil with a photo-varnish, projecting said further mask pattern onto said photo-varnish coating and etching said metal foil to produce said contact mask therefrom.

* * * * *